(12) United States Patent
Seddon et al.

(10) Patent No.: US 10,446,480 B2
(45) Date of Patent: Oct. 15, 2019

(54) THROUGH-SUBSTRATE VIA STRUCTURE AND METHOD OF MANUFACTURE

(71) Applicant: SEMICONDUCTOR COMPONENTS INDUSTRIES, LLC, Phoenix, AZ (US)

(72) Inventors: Michael J. Seddon, Gilbert, AZ (US); Francis J. Carney, Mesa, AZ (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 16/101,259

(22) Filed: Aug. 10, 2018

(65) Prior Publication Data

US 2018/0350733 A1   Dec. 6, 2018

Related U.S. Application Data

(62) Division of application No. 15/244,737, filed on Aug. 23, 2016, now Pat. No. 10,079,199.
(Continued)

(51) Int. Cl.
*H01L 23/498* (2006.01)
*H01L 21/48* (2006.01)
(Continued)

(52) U.S. Cl.
CPC .. *H01L 23/49827* (2013.01); *H01L 21/02035* (2013.01); *H01L 21/288* (2013.01); *H01L 21/304* (2013.01); *H01L 21/308* (2013.01); *H01L 21/3065* (2013.01); *H01L 21/3083* (2013.01); *H01L 21/486* (2013.01); *H01L 21/4825* (2013.01); *H01L 21/4853* (2013.01); *H01L 21/565* (2013.01); *H01L 21/67069* (2013.01); *H01L 21/6835* (2013.01); *H01L 21/76877* (2013.01); *H01L 21/76898* (2013.01); *H01L 21/78* (2013.01); *H01L 22/12* (2013.01);
(Continued)

(58) Field of Classification Search
CPC ......... H01L 23/49827; H01L 21/76898; H01L 23/481; H01L 21/76877; H01L 21/304; H01L 21/4825; H01L 24/05; H01L 21/486; H01L 23/49811; H01L 21/4853; H01L 2224/13025; H01L 2224/05184; H01L 2224/0401; H01L 23/49816; H01L 2224/04042
See application file for complete search history.

(56) References Cited

U.S. PATENT DOCUMENTS 5,122,856 A   6/1992   Komiya
6,252,300 B1  6/2001   Hsuan
(Continued)

*Primary Examiner* — David Vu
(74) *Attorney, Agent, or Firm* — Kevin B. Jackson

(57) ABSTRACT

A through-substrate vias structure includes a substrate having opposing first and second major surfaces. One or more conductive via structures are disposed extending from the first major surface to a first vertical distance within the substrate. A recessed region extends from the second major surface to a second vertical distance within the substrate and adjoining a lower surface of the conductive via. In one embodiment, the second vertical distance is greater than the first vertical distance. A conductive region is disposed within the recessed region and is configured to be in electrical and/or thermal communication with the conductive via.

18 Claims, 6 Drawing Sheets

Related U.S. Application Data

(60) Provisional application No. 62/219,666, filed on Sep. 17, 2015.

(51) Int. Cl.

| | | |
|---|---|---|
| H01L 21/3065 | (2006.01) | |
| H01L 21/78 | (2006.01) | |
| H01L 23/495 | (2006.01) | |
| H01L 21/67 | (2006.01) | |
| H01L 21/66 | (2006.01) | |
| H01L 21/56 | (2006.01) | |
| H01L 23/31 | (2006.01) | |
| H02M 3/158 | (2006.01) | |
| H01L 23/482 | (2006.01) | |
| H01L 25/065 | (2006.01) | |
| H01L 25/00 | (2006.01) | |
| H01L 23/544 | (2006.01) | |
| H01L 23/00 | (2006.01) | |
| H01L 21/02 | (2006.01) | |
| H01L 21/304 | (2006.01) | |
| H01L 21/308 | (2006.01) | |
| H01L 27/146 | (2006.01) | |
| H01L 21/288 | (2006.01) | |
| H01L 21/683 | (2006.01) | |
| H01L 21/768 | (2006.01) | |
| H01L 23/48 | (2006.01) | |
| H01L 27/02 | (2006.01) | |
| H01L 27/088 | (2006.01) | |
| H01L 27/14 | (2006.01) | |
| H01L 29/08 | (2006.01) | |
| H01L 23/15 | (2006.01) | |
| H01L 23/14 | (2006.01) | |
| H01L 23/367 | (2006.01) | |

(52) U.S. Cl.
CPC .......... *H01L 22/26* (2013.01); *H01L 23/3107* (2013.01); *H01L 23/3114* (2013.01); *H01L 23/481* (2013.01); *H01L 23/4822* (2013.01); *H01L 23/4951* (2013.01); *H01L 23/49503* (2013.01); *H01L 23/49541* (2013.01); *H01L 23/49562* (2013.01); *H01L 23/49575* (2013.01); *H01L 23/49811* (2013.01); *H01L 23/49838* (2013.01); *H01L 23/49866* (2013.01); *H01L 23/544* (2013.01); *H01L 23/562* (2013.01); *H01L 24/00* (2013.01); *H01L 24/05* (2013.01); *H01L 25/0655* (2013.01); *H01L 25/0657* (2013.01); *H01L 25/50* (2013.01); *H01L 27/0207* (2013.01); *H01L 27/088* (2013.01); *H01L 27/14* (2013.01); *H01L 27/14683* (2013.01); *H01L 29/0847* (2013.01); *H02M 3/158* (2013.01); *H01L 23/147* (2013.01); *H01L 23/15* (2013.01); *H01L 23/3677* (2013.01); *H01L 23/49816* (2013.01); *H01L 27/14625* (2013.01); *H01L 27/14685* (2013.01); *H01L 2221/68327* (2013.01); *H01L 2223/5446* (2013.01); *H01L 2223/54426* (2013.01); *H01L 2224/0401* (2013.01); *H01L 2224/04042* (2013.01); *H01L 2224/05083* (2013.01); *H01L 2224/05084* (2013.01); *H01L 2224/05124* (2013.01); *H01L 2224/05139* (2013.01); *H01L 2224/05144* (2013.01); *H01L 2224/05147* (2013.01); *H01L 2224/05155* (2013.01); *H01L 2224/05164* (2013.01); *H01L 2224/05166* (2013.01); *H01L 2224/05171* (2013.01); *H01L 2224/05172* (2013.01); *H01L 2224/05184* (2013.01); *H01L 2224/13025* (2013.01); *H01L 2224/13111* (2013.01); *H01L 2224/13116* (2013.01); *H01L 2225/06555* (2013.01); *H01L 2225/06593* (2013.01); *H01L 2225/06596* (2013.01); *H01L 2924/13055* (2013.01); *H01L 2924/13091* (2013.01)

(56) References Cited

U.S. PATENT DOCUMENTS

| | | |
|---|---|---|
| 6,352,923 B1 | 3/2002 | Hsuan |
| 6,461,956 B1 | 10/2002 | Hsuan |
| 8,378,496 B2 | 2/2013 | Schrank |
| 8,492,260 B2 | 7/2013 | Parsey, Jr. et al. |
| 8,872,310 B2 * | 10/2014 | Cobbley ........... H01L 21/76898 257/622 |
| 8,981,533 B2 | 3/2015 | Grivna |
| 9,472,490 B1 | 10/2016 | Sullivan |
| 9,530,857 B2 | 12/2016 | Roozeboom |
| 2001/0005046 A1 | 6/2001 | Hsuan |
| 2006/0131691 A1 | 6/2006 | Roozeboom |
| 2009/0057844 A1 | 3/2009 | Tanida |
| 2010/0264548 A1 * | 10/2010 | Sanders ........... H01L 21/76898 257/774 |
| 2010/0314762 A1 | 12/2010 | Schrank |
| 2014/0070375 A1 | 3/2014 | Grivna |
| 2015/0023376 A1 | 1/2015 | Yamanaka |
| 2015/0155230 A1 | 6/2015 | Cao |

* cited by examiner

THROUGH-SUBSTRATE VIA STRUCTURE AND METHOD OF MANUFACTURE

CROSS-REFERENCE TO RELATED APPLICATIONS

This application is a divisional application of U.S. patent application Ser. No. 15/244,737 filed on Aug. 23, 2016 and issued as U.S. Pat. No. 10,079,199 on Sep. 18, 2018, which claims priority to U.S. Provisional Application No. 62/219,666 filed on Sep. 17, 2015, the content of which is hereby incorporated by reference.

BACKGROUND

The present invention relates, in general, to electronics and, more particularly, to semiconductor device structures and methods of manufacture.

Through-substrate vias, through-silicon vias, or TSVs have been used in electronics manufacturing to provide a vertically oriented electrical connection scheme extending through a semiconductor wafer or die. TSVs have been used as an alternative interconnect technique to flip-chip interconnects and wire bond interconnects. Also, TSVs have been used to create three-dimensional (3D) integrated circuits, which have smaller foot-prints compared to stacked encapsulated or packaged devices.

In addition, TSVs have been used in interposer structures. Interposer structures are electrical interface structures that route electrical signals between multiple integrated circuit devices, spread the electrical connections to a wider pitch, or reroute the electrical connections to a different connection interface. In the past, copper-filled TSVs have been used in interposer structures and tungsten-filled TSVs have been used as a cost-effective alternative in some thin-substrate applications.

Tungsten-filled TSV's have had a limitation in certain process flows that limit their use to semiconductor substrates less than 100 microns thick. For example, certain etch tools used to form the vias have been limited in forming vias with depths up to only 100 microns, which requires that thinner semiconductor wafers be used. Also, deposition tools used to deposit tungsten have been limited in their ability to fill vias greater than 100 microns in depth. However, certain customer demands require that semiconductor wafers used, for example, in interposer structures, be thicker (e.g., 200 microns to 250 microns thick or thicker) to facilitate handling of the interposers and/or the integrated circuits attached to the interposers. The thicker structures are also required to accommodate larger diameter bumps (e.g., greater than about 150 microns). In addition, some applications have required larger interposer die sizes, for example, greater than 15 millimeters (mm) per side, which has not been feasible for a bumped interposer die 100 microns thick or less.

Accordingly, it is desirable to have a method and structure for TSVs that can support, among other things, industry demand for thicker and/or larger die size TSV structures, which are cost-effective, easily integrated into process flows, and supportive of using conductive materials including tungsten. Also, it is desirable for the method and structure to be suitable for use in heat sinking applications.

Figure 1:
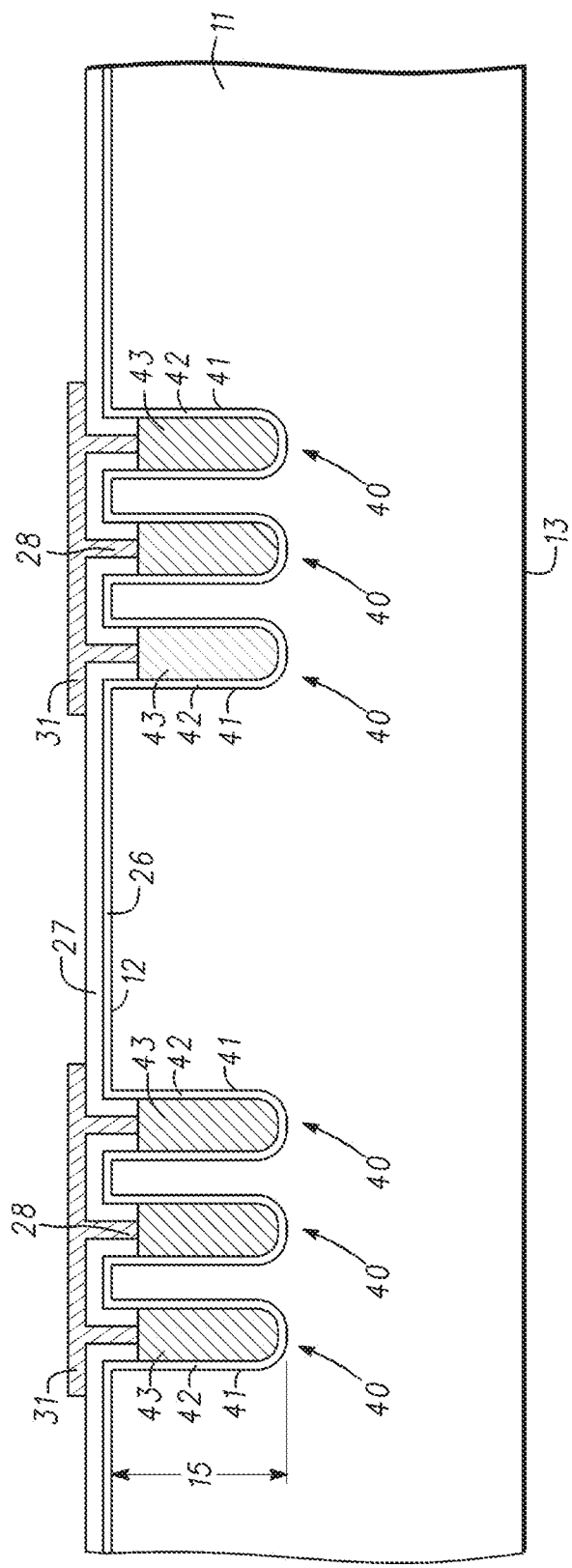
FIG. 1 illustrates an enlarged partial cross-sectional view of a through-substrate via structure at an intermediate stage of fabrication in accordance with an embodiment of the present invention.

For simplicity and clarity of the illustration, elements in the figures are not necessarily drawn to scale, and the same reference numbers in different figures denote the same elements. Additionally, descriptions and details of well-known steps and elements are omitted for simplicity of the description. As used herein, current-carrying electrode means an element of a device that carries current through the device, such as a source or a drain of an MOS transistor, an emitter or a collector of a bipolar transistor, or a cathode or anode of a diode, and a control electrode means an element of the device that controls current through the device, such as a gate of an MOS transistor or a base of a bipolar transistor. Although the devices are explained herein as certain N-type regions and certain P-type regions, a person of ordinary skill in the art understands that the conductivity types can be reversed and are also possible in accordance with the present description, taking into account any necessary polarity reversal of voltages, inversion of transistor type and/or current direction, etc. For clarity of the drawings, certain regions of device structures, such as doped regions or dielectric regions, may be illustrated as having generally straight line edges and precise angular corners. However, those skilled in the art understand that, due to the diffusion and activation of dopants or formation of layers, the edges of such regions generally may not be straight lines and that the corners may not be precise angles. Furthermore, the term major surface when used in conjunction with a semiconductor region, wafer, or substrate means the surface of the semiconductor region, wafer, or substrate that forms an interface with another material, such as a dielectric, an insulator, a conductor, or a polycrystalline semiconductor. The major surface can have a topography that changes in the x, y and z directions. As used herein, the term and/or includes any and all combinations of one or more of the associated listed items. In addition, the terminology used herein is for the purpose of describing particular embodiments only and is not intended to be limiting of the disclosure. As used herein, the singular forms are intended to include the plural forms as well, unless the context clearly indicates otherwise. It will be further understood that the terms comprises, comprising, includes, and/or including, when used in this specification, specify the presence of stated features, numbers, steps, operations, elements, and/or components, but do not preclude the presence or addition of one or more other features, numbers, steps, operations, elements, components, and/or groups thereof. It will be understood that, although the terms first, second, etc. may be used herein to describe various members, elements, regions, layers and/or sections, these members, elements, regions, layers and/or sections should not be limited by these terms. These terms are only used to distinguish one member, element, region, layer and/or section from another. Thus, for example, a first member, a first element, a first region, a first layer and/or a first section discussed below could be termed a second member, a second element, a second region, a second layer and/or a second section without departing from the teachings of the present disclosure. It will be appreciated by those skilled in the art that words, during, while, and when as used herein related to circuit operation are not exact terms that mean an action takes place instantly upon an initiating action, but that there may be some small but reasonable delay, such as propagation delay, between the reaction that is initiated by the initial action. Additionally, the term while means a certain action occurs at least within some portion of a duration of the initiating action. Reference to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but in some cases it may. The use of word about, approximately or substantially means a value of an element is expected to be close to a state value or position. However, as is well known in the art there are always minor variances preventing values or positions from being exactly stated. Unless specified otherwise, as used herein the word over or on includes orientations, placements, or relations where the specified elements can be in direct or indirect physical contact. Unless specified otherwise, as used herein the word overlapping includes orientations, placements, or relations where the specified elements can at least partly or wholly coincide or align in the same or different planes. It is further understood that the embodiments illustrated and described hereinafter suitably may have embodiments and/or may be practiced in the absence of any element that is not specifically disclosed herein.

DETAILED DESCRIPTION OF THE DRAWINGS

The present description includes, among other features, a through-substrate via structure having a conductive via structure extending from a first major surface to a first depth or distance, and a recessed region extending from a second major surface to a second depth or distance. In one embodiment, the second depth is greater than the first depth. A conductive structure is electrically connected to the conductive via within the recessed portion, and the conductive structure is disposed at least along a sidewall surface of the recessed region. The present embodiments provide for, among other things, a more robust and cost effective through-substrate via structure, which can be used for different applications including, for example, interposer structures or heat sinking structures.

More particularly, in one embodiment, a through-substrate via structure comprises a substrate having a first major surface and a second major surface opposite to the first major surface. A conductive via structure comprises a trench extending from the first major surface to a first distance and a conductive material disposed within the trench. A recessed region is disposed extending from the second major surface inward to a second distance, and in one embodiment, the recessed region is wider than the conductive via structure. A first conductive region is disposed at least adjacent and extending along a sidewall surface of the recessed region in cross-sectional view, and in one embodiment, the first conductive region is physically connected to the conductive material. In some embodiments, the conductive material comprises tungsten. In some embodiments, the second distance is greater than the first distance. In some embodiments, the first distance in less than 100 microns. In another embodiment, the first distance is less than about 50 microns. In other embodiments, the first distance is in a range from about 20 microns through about 40 microns. In further embodiments, the first distance is in a range from about 10 microns through about 30 microns. In other embodiments, the first conductive region is further disposed along at least portion of the second major surface. In another embodiment, the conductive via structure further comprises an insulating structure disposed along a sidewall surface of the trench, and the insulating structure is interposed between the conductive material and the sidewall surface of the trench.

In another embodiment, a through-substrate via structure comprises a substrate having a first major surface and a second major surface opposite to the first major surface. A conductive via structure comprises a trench extending from the first major surface to a first distance, an insulating structure is disposed along a sidewall surface of the trench, and a conductive material is disposed adjacent the insulating structure within the trench. A recessed region is disposed extending from the second major surface inward to a second distance, wherein the second distance is greater than the first distance. A first conductive region is disposed at least adjacent and extending along a sidewall surface of the recessed region in cross-sectional view, and in one embodiment, the first conductive region is electrically connected to the conductive material.

In a further embodiment, a method for forming a through-substrate via structure comprises providing a substrate having a first major surface and a second major surface opposite to the first major surface. The method includes providing a conductive via structure comprising a trench extending from the first major surface to a first distance, an insulating structure disposed along a sidewall surface of the trench, and a conductive material disposed adjacent the insulating structure within the trench. The method includes forming a recessed region disposed extending from the second major surface inward to a second distance, wherein the second distance is greater than the first distance. In one embodiment, the second distance is more than twice the first distance. The method includes forming a first conductive region disposed at least adjacent and extending along a sidewall surface of the recessed region in cross-sectional view, and in one embodiment, the first conductive region is electrically coupled to the conductive material. In some embodiments, providing the conductive via structure includes providing the first distance less than about 100 microns. In some embodiments, the method includes forming an insulating layer between first conductive region and the substrate within the recessed region.

FIG. 1 illustrates an enlarged partial cross-sectional view of a structure 10, a substrate structure 10 or a through-substrate via structure 10 at an intermediate stage of fabrication in accordance with a first embodiment. In some embodiments, structure 10 includes a work piece 11, which can be a substrate 11, a body of semiconductor material 11, or a semiconductor substrate 11. In some embodiments, substrate 11 comprises a semiconductor material, including, for example, silicon or other Group IV semiconductor materials, IV-IV semiconductor materials, or III-V semiconductor materials. In one embodiment, substrate 11 is a substantially monocrystalline semiconductor wafer having a (100) crystal plane along major surfaces 12 and 13. In other embodiments, substrate 11 can be a semiconductor-on-insulator material, or an insulating material, such as a ceramic material. In other embodiments, substrate 11 can be glass, quartz, or other similar materials as known to those skilled in the art. Substrate 11 has a major surface 12, such as a first major surface 12 and an opposing major surface 13, such as a second major surface 13.

In accordance with the present embodiment, one or more conductive vias 40, conductive via structures 40, or conductive trench via structure 40 are disposed within substrate 11 extending from first major surface 12 to a first depth 15 or first distance 15. In accordance with the present embodiment, first distance 15 is selected so as to be as small as possible in order to, for example, reduce manufacturing costs and/or improve manufacturability of through-substrate via structure 10. In some embodiments, first depth 15 is less than about 100 microns. In other embodiments, first depth 15 is less than about 75 microns. In further embodiments, first depth 15 is less than about 50 microns. In still further embodiments, first depth 15 is in a range from about 10 microns through about 40 microns. Conductive via structures 40 include a trench 41, which can be formed using photolithographic and etch techniques. In one embodiment, a hard mask structure is provided overlying first major surface 12 and patterned to provide openings in the hard mask structure where trenches 41 will be formed. In some embodiments, the hard mask structure can be an oxide, a nitride, combinations of both, or other protective or masking materials as known to those of skill in the art. In some embodiments, trenches 41 are formed using plasma etching techniques and a chemistry that selectively etches the substrate material at a much higher rate than that of dielectrics and/or other masking material(s). In one embodiment, substrate 11 can be etched using a process commonly referred to as the Bosch process. In other embodiments, trenches 41 can be formed using wet etch techniques. In some embodiments trenches 41 can have a width in range from about 0.2 microns through about 5 microns. It is understood that the width of trenches 41 can vary depending on the depth of the trenches. Trenches 41 can have different shapes and sizes depending on the application.

Conductive via structures 40 further include an insulating structure 42 or an insulating layer(s) 42 disposed along at least sidewall surfaces of trenches 41 in cross-sectional view. In some embodiments, insulating structure 42 can be an oxide material, a nitride material, combinations thereof, or other insulating materials as known to those of skill in the art. In some embodiments, insulating structure 42 is disposed along sidewall and lower or bottom surfaces of trenches 41. In other embodiments, insulating structure 42 can have an opening formed to expose the bottom surfaces of trenches 41 and substrate 11. By way of example, a spacer process can be used to provide the opening in insulating structure 42 proximate to the bottom surfaces of trenches 41. Insulating structure 42 can be formed using thermal oxidation, low-pressure chemical vapor deposition (LPCVD) processes, plasma-enhanced CVD (PECVD) processes, or other processes known to those of skill in the art. In some embodiments, insulating structure 42 has a thickness no greater than 0.9 microns. In other embodiments, insulating structure 42 has a thickness no greater than 0.7 microns. In further embodiments, insulating structure 42 has a thickness of at least 0.1 microns. In another embodiment, insulating structures 42 may not be present.

Conductive via structures 40 further include a conductive material 43 disposed at least within trench 41. In one embodiment, insulating structures 42 are interposed between conductive material 43 and the sidewall and lower surfaces of trenches 41. In one preferred embodiment, conductive material 43 comprises tungsten, which is a more cost effective material in some embodiments compared to, for example, copper materials. Conductive material 43 can be formed using deposition, evaporation, sputtering, plating, or similar techniques as known to those of skill in the art. After conductive material 43 is formed, a planarization process can be used to remove excess material as desired leaving conductive material disposed within trench 41, or conductive material 43 may extend out of trench 41 overlapping major surface 12. In alternative embodiments, conductive material 43 can be a copper material, doped polycrystalline semiconductor material, combinations thereof, or other similar materials as known to those of skill in the art.

In some embodiments, through-substrate via structure 10 further includes insulating layers 26 and 27 disposed over first major surface 12. In one embodiment, insulating layers 26 and 27 comprise different insulating materials, such as an oxide and nitride. In other embodiments, insulating layers 26 and 27 can be similar materials, such as doped and undoped oxides. Openings 28 can be provided in insulating layers 26 and 27 to allow conductive layers 31 to make electrical contact to conductive material 43. Conductive layers 31 can be patterned to provide bonding areas for connecting through-substrate via structure 10 to another device, such as a semiconductor device or other devices as known to those of skill in the art. Conductive layers 31 can be a conductive material including, for example, Al/Ni/Au, Al/Ni/Cu, Cu/Ni/Au, Cu/Ni/Pd, Ti/Ni/Au, Ti/Cu/Ni/Au, Ti—W/Cu/Cu, Cr/Cu/Cu, Cr/Cu/Cu/Ni, Ni—V, Ti/Ni/Ag, or similar materials as known to those of skill in the art.

Figure 2:
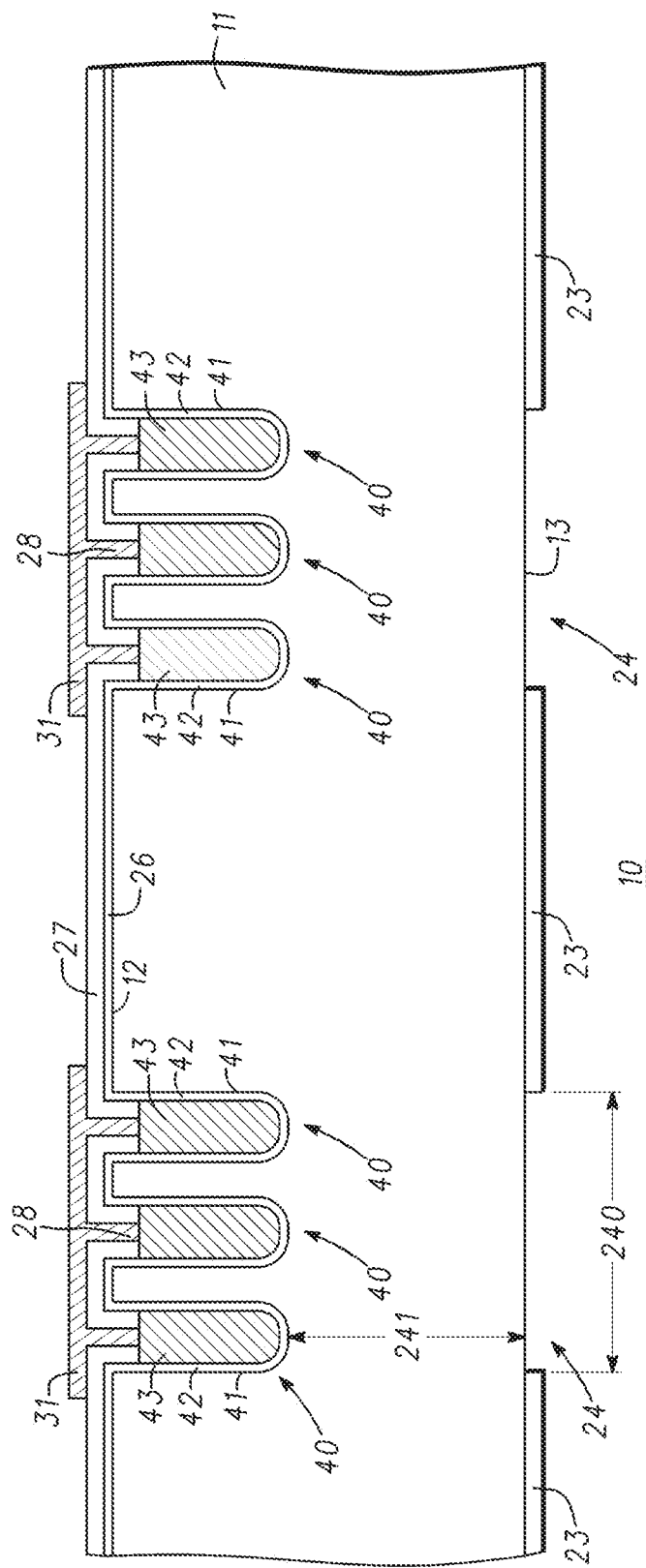
FIG. 2 illustrates an enlarged partial cross-sectional view of the through-substrate via structure of FIG. 1 after additional processing.

FIG. 2 illustrates an enlarged partial cross-sectional view of through-substrate via structure 10 after additional processing. In one embodiment, a masking layer 23 is provided disposed adjacent to second major surface 13 of substrate 11. In one embodiment, masking layer 23 comprises a hard mask structure, such as an oxide or a combination of oxide and nitride. In other embodiments, masking layer 23 can be a polymer material, such as a photoresist material or polyimide material. In some embodiments, masking layer 23 has a thickness in range from about 250 nm through about 1500 nm. Openings 24 are provided within masking layer 23, which preferably vertically coincide with groups of conductive via structures 40 as generally illustrated in FIG. 2. Openings 24 can be provided using photolithographic and removal steps. In some embodiments, a double-sided alignment tool is used to facilitate appropriate alignment with conductive via structures 40.

In some embodiments, openings 24 are provided with a width 240. In one embodiment, width 240 is selected based on second distance 241 between second major surface 13 and the bottom regions of trenches 41. For example, when wet etching techniques are used to form recessed regions 33 (illustrated in FIG. 3), the amount of lateral etching must be taken into to account when determining the width of openings 24. In one embodiment, width 240 increases by a factor of about 10 for every unit of second distance 241. For example, in some embodiments, width 240 increases 10 microns for every 1 micron of second distance 241. In some embodiments, width 240 can be selected based on the final desired width of recessed region 33 at second major surface 13, or selected based on the desired final width of surface 331 (illustrated in FIG. 3) of recessed region 33. In some embodiments, the shape of recessed region 33 is determined by the crystal lattice of substrate 11 and the type of removal processed used to form recessed regions 33. For example, with an isotropic wet etchant, the etch profile will follow the crystal lattice, which defines the angle of the sidewall surfaces of recessed regions 33. Note that FIG. 2 is not drawn to scale, and is exaggerated in the vertical direction so as to make the present embodiment better understood.

Figure 3:
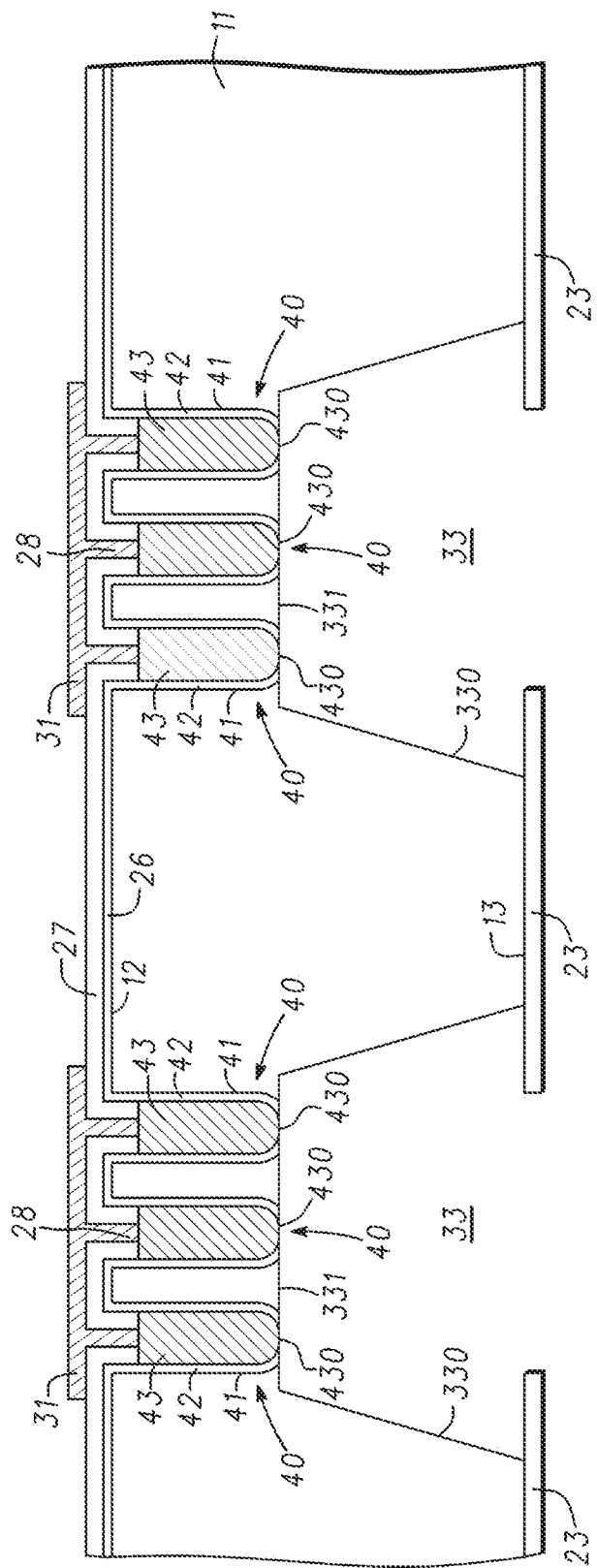
FIG. 3 illustrates an enlarged partial cross-sectional view of the through-substrate via structure of FIG. 1 after further processing.

FIG. 3 illustrates an enlarged partial cross-sectional view of through-substrate via structure 10 after further processing. In one embodiment, a protective layer (not shown) is disposed overlying first major surface 12 to protect conductive layers 31. Next, portions of substrate 11 exposed through openings 240 are removed to form recessed regions 33, which extend inward from second major surface 13. In accordance with the present embodiment, recessed regions 33 extend to second depth 241 or second distance 241 from second major surface 13, and include sidewall portions 330 and surface 331 contiguous with surfaces 430 of conductive material 43 in conductive via structures 40. In one embodiment, an additional etching step can be used to remove portions of insulating structures 42 to expose surfaces 430 of conductive material 43.

In one embodiment, recessed regions 33 are etched using a chemistry that etches substrate 11 at a much higher rate than masking layer 23. By way of example, when substrate 11 comprises silicon, a chemistry including HF/Nitric/Acetic acids can be used. In other embodiments, a caustic solution, such as KOH is used to form recessed regions 33. In still other embodiments, a dry etch process can be used. In accordance with the present embodiment, second distance 241 is greater than first distance 15 and is determined by the difference between the thickness of substrate 11 and the selected first distance 15. In one embodiment, second distance 241 is more than two times greater than distance 15. In some embodiments, second distance 241 is in a range from about 150 microns through about 400 microns. Further, in accordance with the present embodiment, recessed regions 33 are configured to facilitate conductive via structures 40 being shallower compared to related devices where the conductive via structures extend all the way through the full thickness substrate. This allows for tungsten to be used for conductive material 43, which provides for reduced manufacturing costs. In addition, recessed regions 33 allow for substrate 11 to retain a full thickness (or retain a thickness greater than approximately 200 microns or more), which provides substrate 11 with more stability to support demands for larger interposer die sizes, to support larger conductive bumps, and support larger semiconductor devices attached to conductive layers 31.

In some embodiments, sidewall portions 330 have a sloped profile in cross-sectional view. In other embodiments, sidewall portions 330 have a curved profile in cross-sectional view. In still further embodiments, sidewall portions 330 have a substantially vertical profile in cross-sectional view. In some embodiments, the lateral width of surface 331 is less than the lateral width of recessed region 33 proximate to second major surface 13. One benefit of sidewall portions 330 having a sloped profile is that such a profile can provide for, in some embodiments, better metal step coverage in subsequent processing. In accordance with the present embodiment, recessed region 33 is wider than the combined width of conductive via structures 40 adjacent to recessed region 33 as generally illustrated in FIG. 3. That is, the width of surface 331 is greater than the combined width of conductive via structures 40 adjoining recessed region 33.

Figure 4:
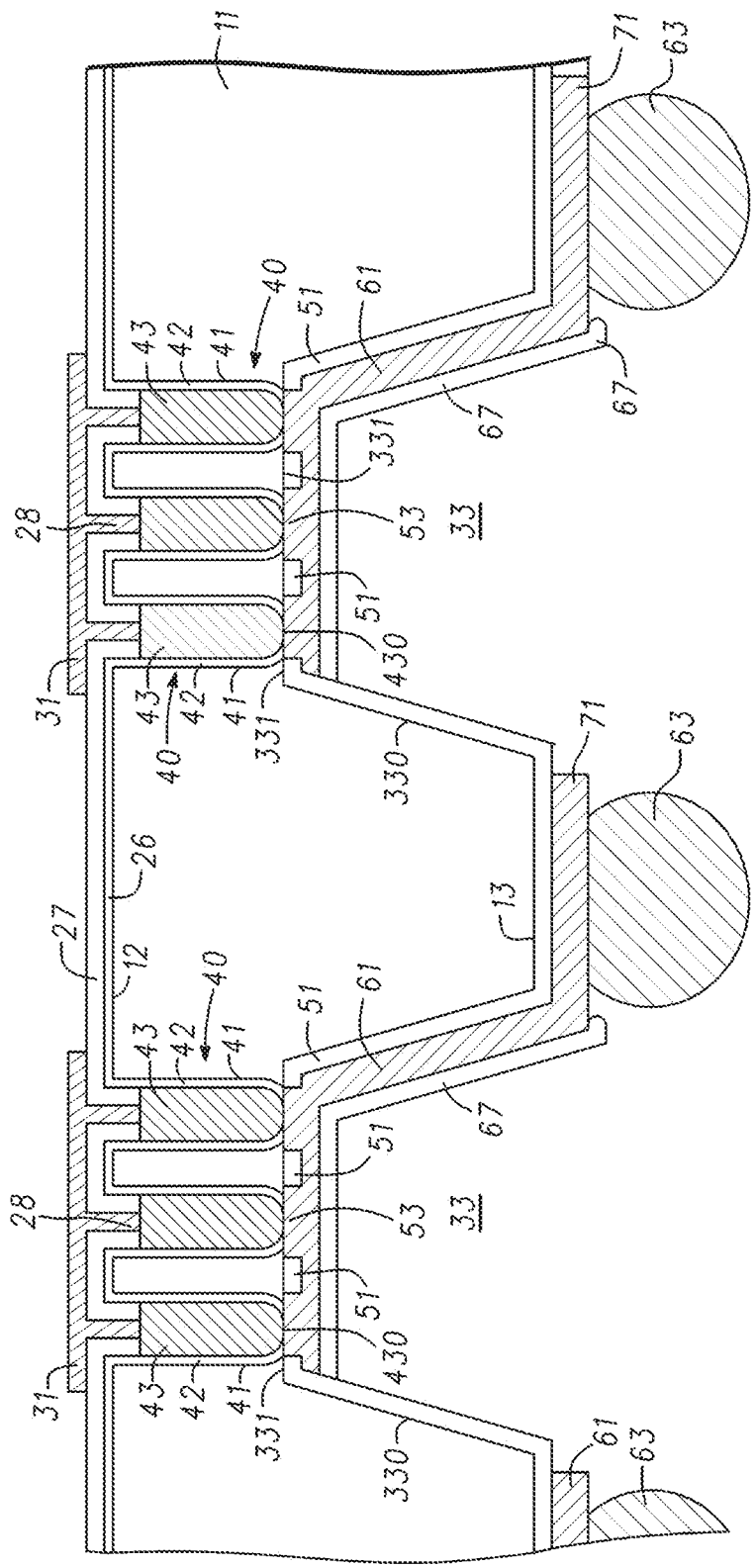
FIG. 4 illustrates an enlarged partial cross-sectional view of the through-substrate via structure of FIG. 1 after still further processing.

FIG. 4 illustrates an enlarged partial cross-sectional view of through-substrate via structure 10 after still further processing. In some embodiments, through-substrate via structure 10 further includes an insulating structure 51 interposed between sidewall portions 330, at least portions of surface 331 and a conductive region 61, conductive layer 61, or conductive structure 61. In some embodiments, insulating structure 51 can be one or more polymer materials, such as a polyimide, and is configured to electrically isolate conductive region 61 from at least portions of substrate 11. Also, insulating structure 51 is configured to reduce stresses between conductive region 61 and substrate 11. In other embodiments, insulating structure 51 can be a dielectric material, such as an oxide, a nitride, combinations thereof including combinations with a polycrystalline semiconductor material, or other similar materials as known to those of skill in the art. Insulating structure 51 can be formed using deposition or growth techniques, lamination techniques, spin-on techniques, and/or other formation techniques as known to those of skill in the art. In some embodiments, openings 53 are provided in insulating structure 51 to facilitate conductive region 61 making physical and/or electrical contact to conductive material 43 within conductive vias 40. In other embodiments, insulating structure 51 may not be present.

In accordance with the present embodiment, conductive regions 61 are disposed along at least one sidewall surface 330 of recessed portions, disposed to be in electrical communication with conductive material 43, and further disposed to overlap second major surface 13 outside of recessed regions 33. In some embodiments, at least one conductive bump 63 or conductive solder structure 63 is disposed on that portion of conductive region 61 overlapping second major surface 13 as generally illustrated in FIG. 4. In some embodiments, conductive regions 61 can be a conductive material including, for example, Al/Ni/Au, Al/Ni/Cu, Cu/Ni/Au, Cu/Ni/Pd, Ti/Ni/Au, Ti/Cu/Ni/Au, Ti—W/Cu/Cu, Cr/Cu/Cu, Cr/Cu/Cu/Ni, Ni—V, Ti/Ni/Ag, or similar materials as known to those of skill in the art. In some embodiments, conductive regions 61 have a thickness greater than 100 nm. In other embodiments, conductive regions 61 have a thickness greater than 1000 nm. Conductive regions 61 can be formed using deposition, evaporation, sputtering, plating, or other techniques as known to those of skill in the art. In one embodiment, photolithographic and etch techniques can be used to pattern conductive region 61 in a predetermined manner In some embodiments, a masking layer 67, solder mask layer 67, or protective layer 67 is disposed adjacent to at least conductive region 61 and patterned to provide exposed bonding pads 71 as generally illustrated in FIG. 4. In one embodiment, protective layer 67 comprises a polymer material, such as polyimide or other organic materials as known to those skilled in the art. In some embodiments, protective layer 67 is further disposed adjacent all sidewall portions 330 including sidewall portions 330 that are devoid of conductive region 61. In other embodiments, protective layer 67 is not used.

Through-substrate via structure 10 further includes conductive bumps 63 disposed adjacent to bonding pad 71 portions of conductive regions 61 as generally illustrated in FIG. 4. In accordance with the present embodiment, conductive bumps 63 are laterally spaced away or apart from conductive via structures 40, and are in electrical communication with conductive via structures 40 through conductive regions 61. Stated another way, in the present embodiment conductive bumps 63 are disposed outside of recessed regions 33. That is, in accordance with some embodiments, conductive bumps 63 are not directly physically attached to conductive material 43 in conductive vias 40. In some embodiments, conductive bumps 63 comprise Sn/Pb solder bumps, lead-free solder bumps, or other reflowable solder bump or ball materials as known to those skilled in the art.

In accordance with the present embodiment, through-substrate via structure 10 is provided with conductive vias 40, which extend to a first depth 15 less than about 100 microns, which facilitates the use of a lower cost conductive material, such as tungsten, compared to copper for conductive material 43 in conductive vias 40. Through-substrate via structure 10 is further provided with recessed regions 33, which facilitate first depth 15 being less than about 100 microns and further facilitate substrate 11 having a full thickness in other regions of substrate 11 outside of recessed regions 33. Thus, through-substrate via structure 10 can be thicker (e.g., 200 microns to 250 microns thick or thicker) compared to related devices that are 100 microns thick or less. Also, this facilitates through-substrate via structure 10 being larger, for example, 15 mm per side semiconductor die, and facilitates the use of multiple or larger semiconductor die with through-substrate via structure 10, and facilitates the use of larger conductive bumps.

Figure 5:
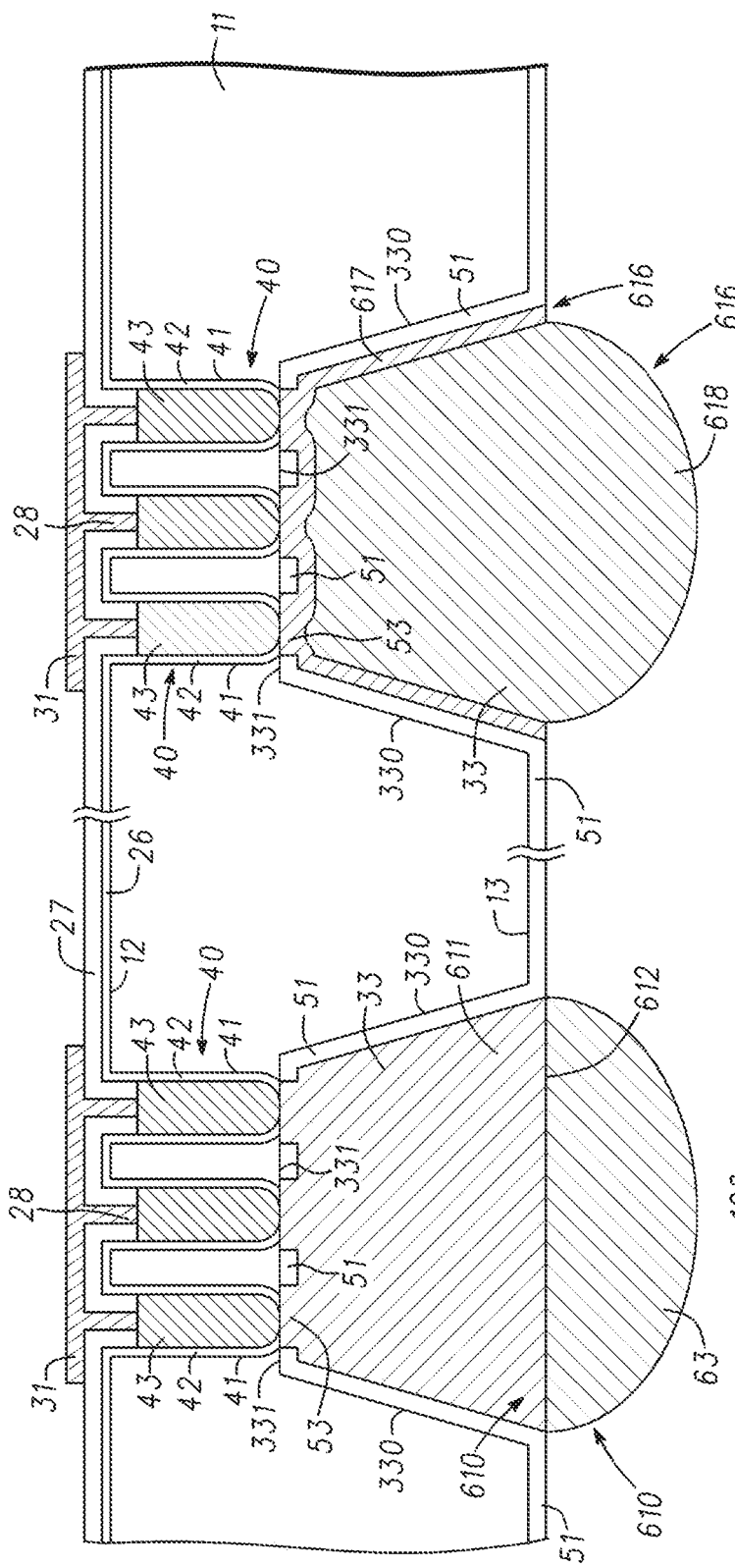
FIG. 5 illustrates an enlarged partial cross-sectional view of through-substrate via structures in accordance with additional embodiments of the present invention.

FIG. 5 illustrates an enlarged partial cross-sectional view of through-substrate via structures 100 and 200 in accordance with two alternative embodiments. Through-substrate via structures 100 and 200 are similar to through-substrate via structure 10, and only the differences will be described hereinafter. Turning first to through-substrate structure 100, conductive region 610 comprises a conductive-fill structure 611 or first conductive portion 611, which is configured to substantially fill recessed region 33. Stated another way, first conductive portion 611 laterally extends completely between opposing sidewall surfaces 330 without an inward step. That is, first conductive portion 611 is other than a conductive liner. In one embodiment, first conductive portion 611 completely fills recessed region 33 so that an outer surface 612 is proximate to second major surface 13. In other embodiments, first conductive portion 611 extends outside of recessed region 33 so that outer surface 612 and second major surface 13 both reside on different planes with outer surface 612 spaced further away from surface 331 than second major surface 13. In one embodiment, first conductive portion 611 comprises copper, a copper alloy or other materials as known to those of skill in the art, and can be formed using deposition, evaporation, sputtering, plating, or other processes as known to those of skill in the art. In one embodiment, conductive region 610 further includes a conductive bump 63 disposed adjoining outer surface 612 of first conductive portion 611. One advantage of through-substrate via structure 100 is that it provides a thicker low cost structure with semi-recessed conductive region 610, which has a reduced height compared to, for example, through-substrate via structure 10.

Through-substrate via structure 200 includes a conductive region 616, which, in one embodiment, includes a conductive liner structure 617 and a conductive bump 618. In one embodiment, conductive liner structure 617 is interposed between conductive bump 618 and insulating structure 51. In one embodiment, conductive liner structure 617 comprises a metal, such as copper or a copper alloy, or other conductive materials as known to those of skill in the art. Conductive liner structure 617 can be formed using deposition, evaporation, sputtering, plating, or other processes as known to those of skill in the art. In one embodiment, conductive bump 618 comprises a Sn/Pb solder bump, a lead-free solder bump, or another reflowable solder bump or ball materials as known to those skilled in the art. In one embodiment, conductive liner structure 617 is disposed on two opposing sidewall surface 330 and surface 331 in cross-sectional view. In one embodiment, conductive bump 618 completely fills recessed region 33 so as to extend outward from second major surface 13. In some embodiments, conductive bump 618 can be formed using a ball drop process, a stencil process, or similar processes as known to those skilled in the art. One advantage of through-substrate via structure 200 is it provides a thicker low cost structure with semi-recessed conductive region 616, which has a reduced height compared to, for example, through-substrate via structure 10.

Figure 6:
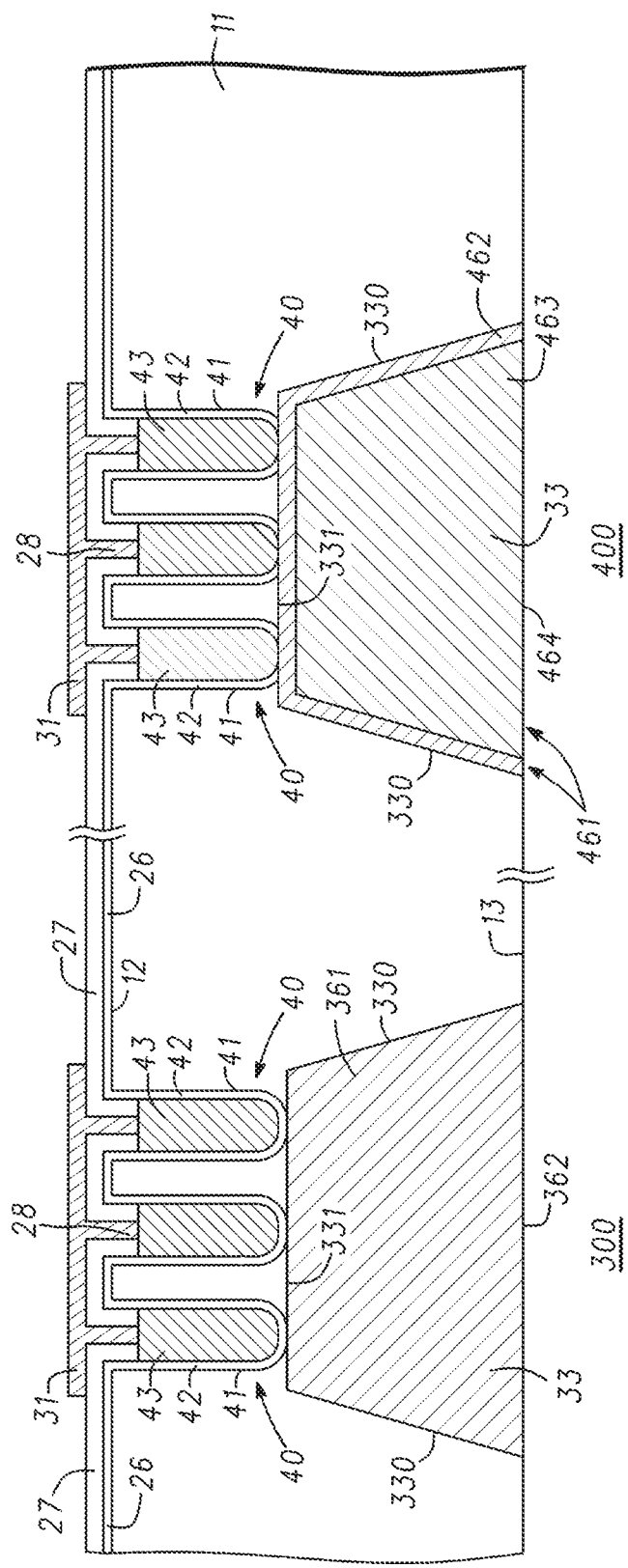
FIG. 6 illustrates an enlarged partial cross-sectional view of through-substrate via structures in accordance with further embodiments of the present invention.

FIG. 6 illustrates an enlarged partial cross-sectional view of through-substrate via structures 300 and 400 in accordance with two alternative embodiments. Through-substrate via structures 300 and 400 are similar to through-substrate via structures 10, 100, and 200 and only the differences will be described hereinafter. In accordance with the present embodiment, through-substrate via structures 300 and 400 are heat sinking structures configured to address thermal crowding that may occur in active structures disposed adjacent first major surface 12 of substrate 11. In some embodiments, conductive vias 40 do not have to be electrically connected to input/output (I/O) structures, and instead can be configured as part of the heat sinking structure to reduce, for example, thermal transient issues.

Through-substrate via structure 300 includes a conductive region 361 disposed within recessed region 33. Similar to through-substrate via structure 100, conductive region 361 comprises a conductive fill structure, which is configured to substantially fill recessed region 33. Stated another way, conductive region 361 laterally extends completely between opposing sidewall surfaces 300 without an inward step. That is, conductive region 361 is other than a conductive liner. In one embodiment, conductive region 361 completely fills recessed region 33 so that an outer surface 362 is proximate to second major surface 13. In other embodiments, outer surface 362 can extend outward from second major surface 13. In accordance with the present embodiment, outer surface 362 can be connected to a next level of assembly, such as an additional heat sink structure. In some embodiments, conductive region 361 comprises one or metal materials, such as copper or a copper alloy, and can be formed using deposition, evaporation, sputtering, screen printing, plating or other processes as known to those of skill in the art. In one embodiment, insulating structures 42 in conductive vias 40 can electrically isolate (but not thermally isolate) conductive material 43 from conductive region 361. In other embodiments, conductive material 43 can be electrically connected to conductive region 362 as in other embodiments described previously. Although not illustrated, insulating structure 51 can be interposed between surfaces of recessed region 33 and conductive region 361 with or without openings 53 as illustrated in other embodiments.

Through-substrate via structure 400 includes a conductive region 461, which, in one embodiment, includes a conductive liner structure 462 and a conductive fill structure 463. In one embodiment, conductive liner structure 462 is interposed between surfaces of recessed region 33 and conductive fill structure 463. In one embodiment, conductive liner structure 462 comprises a metal, such as copper or a copper alloy, or other thermally conductive materials as known to those of skill in the art. Conductive liner structure 462 can be formed using deposition, evaporation, sputtering, plating, or other processes as known to those of skill in the art. In one embodiment, conductive fill structure 463 comprises a Sn/Pb solder, a lead-free solder, or other reflowable solder materials as known to those skilled in the art. In some embodiments, conductive fill structure 463 can be formed using a ball drop process, a stencil process, or similar processes as known to those skilled in the art. In one embodiment, conductive liner structure 462 is disposed on two opposing sidewall surface 330 and surface 331 in cross-sectional view. In one embodiment, conductive fill structure 463 completely fills recessed region 33 so as to extend proximate to second major surface 13. In one embodiment, conductive material 43 is electrically connected to conductive region 461. In other embodiments, conductive material 43 is electrically isolated, but in thermal communication with conductive region 461. Although not illustrated, insulating structure 51 can be interposed between surfaces of recessed region 33 and conductive region 461 with or without openings 53 as illustrated in other embodiments.

In view of all of the above, it is evident that a novel method and structure is disclosed. Included, among other features, is a through-substrate via structure having one or more conductive via extending only partially inward within a substrate from a first major surface. A recessed region is disposed extending inward from a second major surface to the conductive via. In one embodiment, a conductive region is disposed within the recessed region to electrically connect the conductive via to another conductive structure, such as a conductive bump. Among other things, the through-substrate via structure facilities a thicker substrate structure while also facilitating the use of more cost-effective conductive materials for the via structure, such as tungsten. Also, the structure is better suited for use with larger electronic die and is more robust against warpage and breakage. In other embodiments, the through-substrate via structure is configured as a heat sinking structure for reducing thermal crowding issues with active devices disposed adjacent one surface of the through-substrate via structure.

While the subject matter of the invention is described with specific preferred embodiments and example embodiments, the foregoing drawings and descriptions thereof depict only typical embodiments of the subject matter, and are not therefore to be considered limiting of its scope. It is evident that many alternatives and variations will be apparent to those skilled in the art. For example, substrate 11 can be provided with an edge support ring structure.

As the claims hereinafter reflect, inventive aspects may lie in less than all features of a single foregoing disclosed embodiment. Thus, the hereinafter expressed claims are hereby expressly incorporated into this Detailed Description of the Drawings, with each claim standing on its own as a separate embodiment of the invention. Furthermore, while some embodiments described herein include some but not other features included in other embodiments, combinations of features of different embodiments are meant to be within the scope of the invention and meant to form different embodiments as would be understood by those skilled in the art.

We claim:

1. A through-substrate via structure comprising:
    a substrate having a first major surface and a second major surface opposite to the first major surface;
    a conductive via structure comprising:
        a trench extending from the first major surface to a first distance; and
        a conductive material disposed within the trench;
    a recessed region disposed extending from the second major surface inward to a second distance, wherein the recessed region is wider than the conductive via structure;
    a first conductive region disposed so as to completely fill the recessed region; and
    an insulating layer disposed between the first conductive region and the substrate within the recessed region, wherein:
        the insulating layer comprises an opening that exposes the conductive material;
        the insulating layer extends outside of the recessed region and overlaps the second major surface;
        the insulating layer comprises an outer surface distal to and overlapping the second major surface outside of the recessed region;
        the first conductive region comprises:
            a conductive layer disposed within the recessed region adjacent to and extending along a surface of the insulating layer; and
            a solder region disposed within the recessed region and adjacent to the conductive layer;
        the conductive layer is interposed between the solder region and the insulating layer;
        an uppermost portion of the conductive layer is substantially coplanar with the outer surface of the insulating layer; and
        the conductive layer extends into the opening and is physically and electrically coupled to the conductive material through the opening.

2. The structure of claim 1, wherein:
at least a portion of the conductive layer comprises copper.

3. The structure of claim 1, wherein:
the conductive layer physically contacts the conductive material at an interface between the substrate and the insulating layer.

4. The structure of claim 1, wherein:
the conductive material comprises tungsten;
the second distance is greater than or equal to 150 microns;
the first distance is less than about 50 microns; and
the through-substrate via structure comprises an interposer structure.

5. The structure of claim 1, wherein:
the conductive material comprises tungsten.

6. The structure of claim 1, wherein:
the insulating layer comprises a polymer.

7. The structure of claim 1, wherein:
the first conductive region protrudes outward from the recessed region and outward from the second major surface.

8. The structure of claim 1, wherein:
the solder region extends outside of the recessed region such that a distal end portion of the solder region protrudes outward with respect to the outer surface of the insulating layer.

9. The structure of claim 1, wherein:
the substrate comprises an insulating material.

10. A through-substrate via structure comprising:
a substrate having a first major surface and a second major surface opposite to the first major surface;
a conductive via structure comprising:
    a trench extending from the first major surface to a first distance;
    an insulating structure disposed along a sidewall surface of the trench; and
    a conductive material disposed adjacent to the insulating structure within the trench;
a recessed region disposed extending from the second major surface inward to a second distance, wherein the second distance is greater than the first distance, and wherein the second distance is greater than or equal to about 150 microns;

a first conductive region disposed so as to completely fill the recessed region; and an insulating layer disposed between the first conductive region and the substrate within the recessed region, wherein:

the insulating layer comprises an opening that exposes the conductive material;

the insulating layer extends outside of the recessed region and overlaps the second major surface;

the insulating layer comprises an outer surface distal to and overlapping the second major surface outside of the recessed region;

the first conductive region comprises:
a conductive layer disposed within the recessed region adjacent to and extending along a surface of the insulating layer; and
a solder region disposed within the recessed region and adjacent to the conductive layer;

the conductive layer is interposed between the solder region and the insulating layer; and the conductive layer extends inside of the opening and physically contacts the conductive material at an interface between the substrate and the insulating layer.

11. The structure of claim 10, wherein:
the first distance is less than about 50 microns; and
at least a portion of the first conductive region comprises copper.

12. The structure of claim 10, wherein:
an uppermost portion of the conductive layer is substantially coplanar with the outer surface of the insulating layer; and
the solder region extends outside of the recessed region such that a distal end portion of the solder region protrudes outward with respect to the outer surface of the insulating layer.

13. The structure of claim 10, wherein:
the insulating layer comprises a polymer material; and
the conductive material comprises tungsten.

14. A through-substrate via structure comprising:
a substrate having a first major surface and a second major surface opposite to the first major surface;
a conductive via structure comprising:
a trench extending from the first major surface to a first distance; and
a conductive material comprising tungsten disposed within the trench;

a recessed region disposed extending from the second major surface inward to a second distance, wherein the recessed region is wider than the conductive via structure;

a first conductive region disposed so as to completely fill the recessed region; and an insulating layer disposed between the first conductive region and the substrate within the recessed region, wherein:

the insulating layer comprises an opening that exposes the conductive material;

the insulating layer extends outside of the recessed region and overlaps the second major surface;

the insulating layer comprises an outer surface distal to and overlapping the second major surface outside of the recessed region;

the first conductive region comprises:
a conductive layer disposed within the recessed region adjacent to and extending along a surface of the insulating layer; and
a solder region disposed within the recessed region and adjacent to the conductive layer;

the conductive layer is interposed between the solder region and the insulating layer; and an uppermost portion the conductive layer is substantially coplanar with the outer surface of the insulating layer proximate to where the recessed region meets the second major surface.

15. The structure of claim 14, wherein:
the solder region extends outside of the recessed region such that a distal end portion of the solder region protrudes outward with respect to the outer surface of the insulating layer.

16. The structure of claim 14, wherein:
the recessed region extends into the substrate a distance greater than or equal to about 150 microns; and
the conductive layer extends into the opening and is physically and electrically coupled to the conductive material through the opening at an interface between the insulating layer and the substrate.

17. The structure of claim 14, wherein:
than the first distance is less than 50 microns; and
at least a portion of the first conductive region comprises copper.

18. The structure of claim 14, wherein:
the through-substrate via structure comprises an interposer having at least one side with a width of at least 15 millimeters.

* * * * *

UNITED STATES PATENT AND TRADEMARK OFFICE
CERTIFICATE OF CORRECTION

PATENT NO. : 10,446,480 B2
APPLICATION NO. : 16/101259
DATED : October 15, 2019
INVENTOR(S) : Seddon et al.

Page 1 of 1

It is certified that error appears in the above-identified patent and that said Letters Patent is hereby corrected as shown below:

In the Claims

In Column 14, Line 42, Claim 17, delete "than", therefor.

Signed and Sealed this
Twelfth Day of July, 2022

Katherine Kelly Vidal
*Director of the United States Patent and Trademark Office*